(12) United States Patent
Grossier et al.

(10) Patent No.: US 10,254,338 B2
(45) Date of Patent: Apr. 9, 2019

(54) SEMICONDUCTOR DEVICE AND CORRESPONDING DEBUGGING METHOD

(71) Applicant: STMICROELECTRONICS S.R.L., Agrate Brianza (IT)

(72) Inventors: Nicolas Bernard Grossier, Oreno di Vimercate (IT); Lorenzo Guerrieri, Aosta (IT); Giuseppe Livio Gobbato, Milan (IT); Daniele Zerbini, Vimercate (IT); Martina Cordoni, Riese Pio X (IT); Pasqualina Fragneto, Burago di Molgora (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 86 days.

(21) Appl. No.: 15/221,211

(22) Filed: Jul. 27, 2016

(65) Prior Publication Data

US 2017/0315175 A1 Nov. 2, 2017

(30) Foreign Application Priority Data

Apr. 29, 2016 (IT) .................. 102016000044145

(51) Int. Cl.
*G01R 31/3177* (2006.01)
*G01R 31/317* (2006.01)
(Continued)

(52) U.S. Cl.
CPC ....... *G01R 31/31713* (2013.01); *G01R 31/28* (2013.01); *G01R 31/3177* (2013.01);
(Continued)

(58) Field of Classification Search
CPC .......... G01R 31/31713; G01R 31/3177; G01R 31/28; G06F 11/3636; G06F 11/364; G06F 11/3656; G06F 1/26; G06F 11/24; G06F 11/3024; G06F 11/3062; G06F 11/3648; H04B 3/54; H04B 3/542; H04B 2203/5495; H05B 37/0263; H02J 13/0089; H02J 13/0093; H02J 13/0096
(Continued)

(56) References Cited

U.S. PATENT DOCUMENTS 5,031,082 A * 7/1991 Bierend .............. H02J 13/0089
340/12.33
7,321,291 B2 * 1/2008 Gidge ..................... H04B 3/58
340/12.38
(Continued)

OTHER PUBLICATIONS

Paul Darbee, INSTEON Developer's Guide, Aug. 16, 2007, SmartLabs Technology, pp. 1-384.*
(Continued)

*Primary Examiner* — John J Tabone, Jr.
(74) *Attorney, Agent, or Firm* — Seed IP Law Group LLP

(57) ABSTRACT

A semiconductor device, for example an integrated circuit such as a microcontroller (MCU) or a digital signal processor (DSP), includes a semiconductor die coupled with a power supply line, a debug module coupled with the semiconductor die to exchange semiconductor die debug command and data signals with the semiconductor die, and a modem coupled with the power supply line. The debug module is arranged to convey the semiconductor die debug command and data signals over the power supply line.

20 Claims, 5 Drawing Sheets

(51) Int. Cl.
| | |
|---|---|
| *H04B 3/54* | (2006.01) |
| *H02J 13/00* | (2006.01) |
| *H05B 37/02* | (2006.01) |
| *G06F 11/30* | (2006.01) |
| *G01R 31/28* | (2006.01) |
| *G06F 11/36* | (2006.01) |
| *G06F 11/24* | (2006.01) |
| *G06F 1/26* | (2006.01) |

(52) U.S. Cl.
CPC ............... *G06F 1/26* (2013.01); *G06F 11/24* (2013.01); *G06F 11/3024* (2013.01); *G06F 11/3062* (2013.01); *G06F 11/364* (2013.01); *G06F 11/3636* (2013.01); *G06F 11/3648* (2013.01); *G06F 11/3656* (2013.01); *H02J 13/0089* (2013.01); *H02J 13/0093* (2013.01); *H02J 13/0096* (2013.01); *H04B 3/54* (2013.01); *H04B 3/542* (2013.01); *H05B 37/0263* (2013.01); *H04B 2203/5495* (2013.01)

(58) Field of Classification Search
USPC ........................................................ 714/726
See application file for complete search history.

(56) References Cited

U.S. PATENT DOCUMENTS

| | | | | |
|---|---|---|---|---|
| 8,595,562 | B2* | 11/2013 | Sato .................. | G06F 1/26 714/45 |
| 8,867,594 | B2* | 10/2014 | Shad .................. | H04B 3/54 375/224 |
| 9,344,151 | B2* | 5/2016 | Cenizal .............. | H02J 13/00 |
| 9,544,975 | B2* | 1/2017 | Giltaca ............... | H05B 37/0218 |
| 9,807,855 | B2* | 10/2017 | Lyons ................ | H05B 37/0263 |
| 2002/0072817 | A1* | 6/2002 | Champion .......... | H04H 20/82 700/94 |
| 2004/0227621 | A1* | 11/2004 | Cope .................. | G02B 6/483 370/487 |
| 2004/0250164 | A1* | 12/2004 | Ahmad ............... | G06F 11/364 714/30 |
| 2006/0097573 | A1* | 5/2006 | Gidge ................ | H04B 3/58 307/3 |
| 2006/0179374 | A1 | 8/2006 | Noble | |
| 2006/0221995 | A1* | 10/2006 | Berkman ............ | H04L 12/5692 370/463 |
| 2006/0291497 | A1* | 12/2006 | Binder ................ | H04B 3/54 370/436 |
| 2007/0002771 | A1* | 1/2007 | Berkman ............ | H04B 3/542 370/257 |
| 2008/0130640 | A1* | 6/2008 | Hurwitz .............. | H04B 3/54 370/389 |
| 2009/0060060 | A1* | 3/2009 | Stadelmeier ....... | H04B 3/542 375/257 |
| 2009/0252208 | A1* | 10/2009 | Frye, Jr. ............. | H04B 3/54 375/222 |
| 2011/0051721 | A1* | 3/2011 | Brothwell .......... | H04B 3/54 370/353 |
| 2012/0133298 | A1* | 5/2012 | Campbell ........... | H05B 37/0263 315/250 |
| 2012/0195355 | A1* | 8/2012 | El-Essawy .......... | H04B 3/54 375/222 |
| 2012/0327770 | A1* | 12/2012 | Vijayasankar ..... | H04L 47/127 370/235 |
| 2013/0315286 | A1* | 11/2013 | Shad .................. | H04B 3/54 375/224 |
| 2014/0251523 | A1* | 9/2014 | Kellhammer ....... | B65C 9/40 156/60 |
| 2015/0262569 | A1 | 9/2015 | Dabak et al. | |
| 2017/0116103 | A1* | 4/2017 | Cencini ............. | G06F 11/3055 |
| 2017/0164452 | A1* | 6/2017 | Lyons, Sr. ......... | H05B 37/0263 |
| 2017/0171947 | A1* | 6/2017 | Campbell ........... | H05B 37/0263 |
| 2018/0049299 | A1* | 2/2018 | Lyons, Sr. ......... | H05B 37/0272 |
| 2018/0097543 | A1* | 4/2018 | Logvinov ........... | H05B 37/0263 |

OTHER PUBLICATIONS

Cypress, Powerline Communication Solutions, 2009-2012, Cypress Semiconductor Corporation, pp. 1-2.*

Italian Search Report, dated Nov. 24, 2016, for Italian application No. 102016000044145, 2 pages.

* cited by examiner

SEMICONDUCTOR DEVICE AND CORRESPONDING DEBUGGING METHOD

BACKGROUND

Technical Field

The description relates to debugging techniques for semiconductor devices. One or more embodiments may be applied to debugging integrated circuits (ICs) such as, e.g., microcontrollers.

Description of the Related Art

Software intended to run on devices such as integrated circuits (and possibly also device hardware) may be debugged using two main mechanisms, namely trace and debug proper.

Trace is based on a unidirectional flow that is generated sequentially. Data trace output information makes it possible to re-construct in a (remote) debug environment (e.g., a PC) an actual software flow executed in the semiconductor device ("on the silicon").

Depending on application, the related information may be transmitted at variable data rates, an exemplary order of magnitude being hundreds of Mbit/s.

In the case of a debug mechanism proper, engineer/control software cooperates directly in a two-way interactive flow with the device under test. Break point and debug statements may be included as parts of such a flow: the associated information may thus be sent at data rates which may be lower in comparison with trace operation: data rates from 1 to about 10 Mbit/s may be exemplary of such applications.

On the one hand, a faster rate may be used for code download within a device memory, while, on the other hand, a continuous flow may not be necessary, so that a lower flow rate may not represent a critical issue to control/monitor.

Semiconductor devices such as microcontrollers have been used for many years in a broad range of applications. With the advent of lower pin-count offerings, microcontrollers make embedded processing available just about everywhere—from automotive electronics to wearable devices.

As the demand for these lower pin-count devices increases, the amount of overhead pins involved may represent a critical issue.

Such overhead pins may not be directly available to the user for an application. In embedded programmable devices, this may include all the pins possibly involved in functions such as interfacing with software/hardware tools related to debugging, programming the device and its firmware, providing support for internal testing, e.g., by the semiconductor manufacturer.

Despite the extensive activity in that area, the need is still felt for improved solutions capable of dispensing with the disadvantages of those solutions involving a relevant amount of overhead pins.

The subject matter discussed in the Background section is not necessarily prior art and should not be assumed to be prior art merely as a result of its discussion in the Background section. Along these lines, the recognition of one or more problems in the prior art discussed in the Background section and the subject matter associated therewith should not be treated as prior art unless expressly stated to be prior art. Instead, the discussion in the Background section encompassing one or more recognized problems in the prior art should be treated as part of the inventor's approach to the particular problem, which in and of itself may also be inventive.

BRIEF SUMMARY

One or more embodiments aim at providing a response to such a need for improved solutions capable of dispensing with the disadvantages of prior solutions involving a relevant amount of overhead pins.

One or more embodiments may achieve desirable results by means of a device as set forth in the claims that follows.

One or more embodiments may also relate to a corresponding method.

The claims constitute an integral part of the disclosure of the embodiments as provided herein.

One or more embodiments may be used, e.g., in those applications where board dimensions or board cost may be critical and/or those systems having a certain degree of complexity (e.g., for applications in the automotive field, server connections, mobile communications).

One or more embodiments may facilitate achieving a short time to market for the customer, allowing one version of application board, optimization of performance (e.g., engine calibration in the automotive field) and/or software compatibility (e.g., for mobile applications), while also improving debugging performance, especially in the case of challenging systems in terms of dimensional requirements (e.g., for the automotive field).

One or more embodiments may be used in applications involving post-qualification debug/performance control, e.g., from independent access points: safety, medical, aerospace applications and certain industrial applications such as nuclear/chemical applications are exemplary of those applications.

One or more embodiments may permit continuous functionality checks, in situ control or maintenance.

One or more embodiments may be used in applications involving independent access, e.g., through a power line as an alternative to direct access.

One or more embodiments may be applied to systems such as underwater systems, systems involving remote switching/maintenance (e.g., over long distances or at long range) and/or adverse environments (sea, desert, and the like).

One or more embodiments may be applied to testing applications/products in those situations where the pin number may be limited in comparison to the internal complexity of the device. Such applications may include, e.g., system-on-package arrangements, multiple-die arrangements involving different technologies, "internal" devices not adapted to be connected externally, wearable devices, implanted medical devices.

One or more embodiments may be applied in areas where continuous improvement through failure analysis may represent an interesting feature. Such sectors may include the automotive sector, safety and medical sectors or applications involving fast "ramp up" of new solutions (e.g., in the mobile communications area).

BRIEF DESCRIPTION OF THE SEVERAL VIEWS OF THE DRAWINGS

Non-limiting and non-exhaustive embodiments are described with reference to the following drawings, wherein like labels refer to like parts throughout the various views unless otherwise specified. One or more embodiments will now be described, by way of example only, with reference to the annexed figures, wherein.

DETAILED DESCRIPTION

In the ensuing description, one or more specific details are illustrated, aimed providing an in-depth understanding of examples of embodiments of the instant description. The embodiments may be obtained by one or more of the specific details or with other methods, components, materials, and so on. In other cases, known structures, materials or operations are not illustrated or described in detail so that certain aspects of embodiment will not be obscured.

Reference to "an embodiment" or "one embodiment" in the framework of the present description is intended to indicate a particular configuration, structure, characteristic described in relation to the embodiment is compliance in at least one embodiment. Hence, phrases such as "in an embodiment" or "in one (or more) embodiments" that may be present in one or more points in the present description do not necessarily refer to one and the same embodiment. Moreover, particular conformation, structures or characteristics as exemplified in connection with any of the figures may be combined in any other quite way in one or more embodiments as possibly exemplified in other figures.

The references used herein are provided merely for convenience and hence do not define the extent of protection or the scope of the embodiments.

As discussed, a trend exists towards reducing the number of overhead pins in semiconductor devices, such as integrated circuits, e.g., embedded systems.

To that end, interfaces exploiting a reduced number of interconnects to a device have been proposed. The possibility has also been contemplated of relying on the adoption of pins which are multiplexed with the existing functional pins of a device. This may reduce the overall pin count, with the disadvantage that only a part of the functional pins may be readily available during debug or emulation. Additionally, multiplexing may make hardware and firmware development fairly challenging.

Document US 2015/0262569 A1 discloses a method employing microcontrollers with an ultrasound transducer for ultrasound chip debugging. Such a solution may exhibit various drawbacks, primarily due to its being dependent on the stability of the propagation channel, thus making it necessary, e.g., to provide continuous physical contact or use specific package material. Additionally, ultrasound debug communication may involve the use of low frequencies, which may not be convenient for certain environments such as the automotive environment where electromagnetic compatibility issues may arise with other electronics installed in a vehicle.

Document US 2006/0179374 A1 discloses wireless hardware debugging. An exemplary boundary scan system for debugging a digital circuit may include a boundary scan interface configured to couple to the digital circuit. Also, a dedicated device for each functionality is contemplated.

Figure 1:
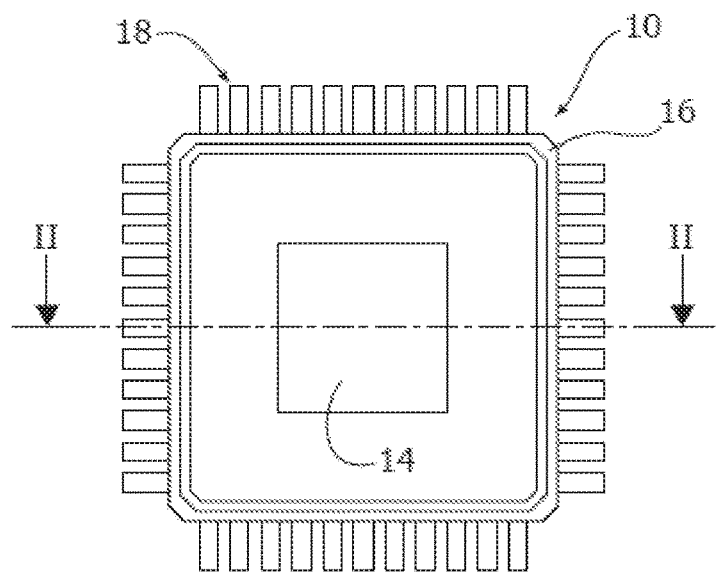
FIG. 1 is a plan view of a semiconductor device such as an integrated circuit.
Figure 2:
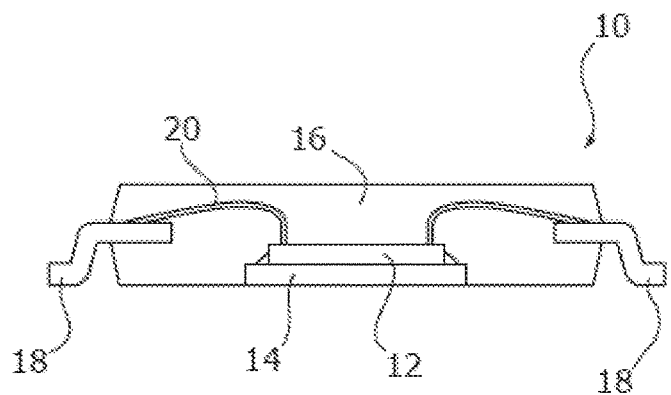
FIG. 2 is a cross-sectional view along line II-II of FIG. 1.

FIGS. 1 and 2 are exemplary of a semiconductor device 10 such as, e.g., microcontroller (Micro Controller Unit—MCU) or Digital Signal Processor (DSP).

FIGS. 1 and 2 are exemplary of a so-called "production" device (PD) including a semiconductor die (or device proper) 12 mounted, e.g., on a die support pad 14 and enclosed in a package 16, with an array of contact pins 18 electrically connected to the die 12 via bonding wires 20.

FIG. 1 is a plan view from the bottom where the die support pad 14 is visible exposed at the bottom of the package 16.

The arrangement exemplified in FIGS. 1 and 2 is otherwise conventional in the art, thus making it unnecessary to provide a more detailed description herein.

In one or more embodiments as exemplified in FIG. 3 the structure of a "production" device discussed in connection with FIGS. 1 and 2 may be supplemented—e.g., within the framework of a so-called FusionQuad (flip-stack) package—with additional debug circuitry (e.g., an additional die 22). This may be stacked (in a manner known per se) at 24 onto the die 12.

In one or more embodiments, the additional die 22 may include a memory (e.g., RAM) and/or interface circuitry, with the possibility of facilitating the provision of improved features for debugging and tracing (hereinafter generally referred to jointly as "debugging").

Figure 3:
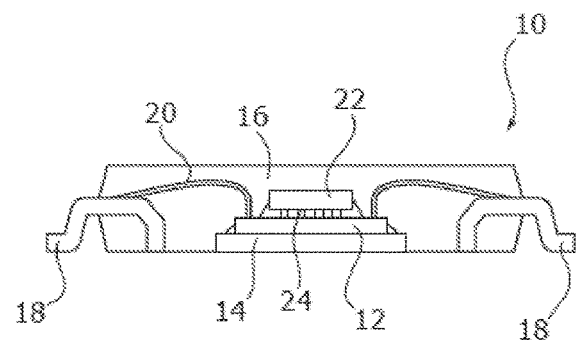
FIG. 3 is a cross-sectional view substantially corresponding to the cross-sectional view of FIG. 2 and exemplary of one or more embodiments.

It will be appreciated that the "emulation" device 10 of FIG. 3 (possibly including a "buddy" extra chip 22 dedicated to debugging) may be embedded in a single package, with the possibility of, e.g., sharing the same footprint (e.g., the same Ball Grid Array—BGA footprint) of the "production" device 10 of FIGS. 1 and 2.

Figure 4:
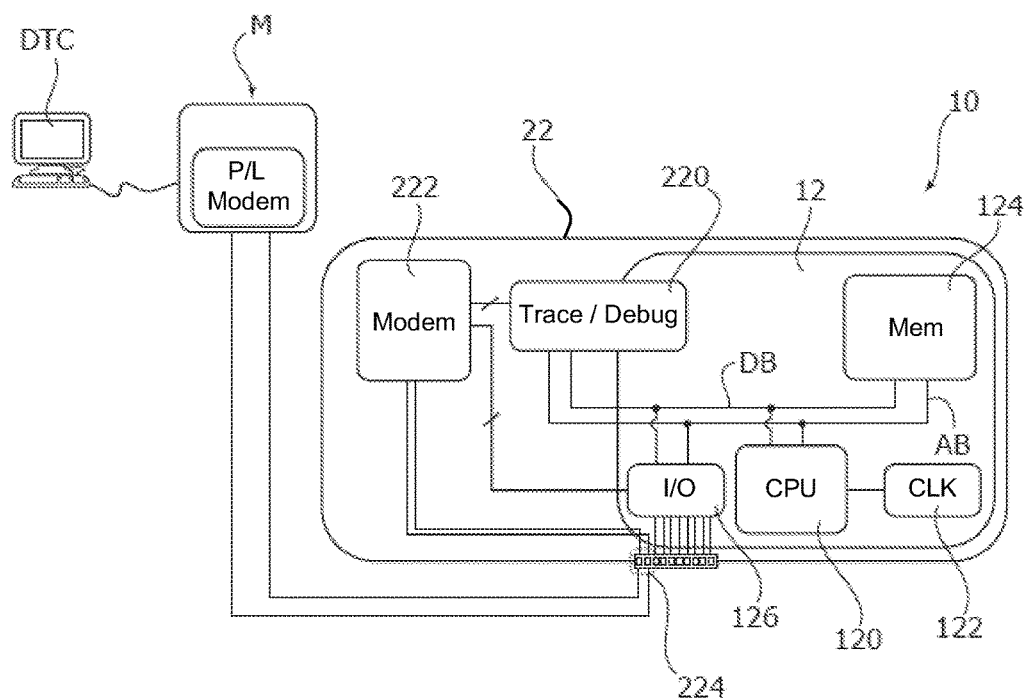
FIG. 4 is a block diagram exemplary of one or more embodiments.

The block diagram of FIG. 4 (and, consistently, the block diagrams of FIGS. 5 and 6) illustrate an exemplary case where the die 12 may include an embedded system comprising a Central Processing Unit—CPU 120 with an associated clock 122, a program and data memory 124 and an input/output interface 126. A data bus DB and an address bus AB may also be provided in order to permit exchange of data and addresses within the system 12. Such a basic system architecture may correspond to the architecture of a "production" device 10 as exemplified in FIGS. 1 and 2.

In one or more embodiments as exemplified in FIG. 3 such a basic device architecture may be supplemented with the additional die 22, which may include a trace/debug module 220 and a "power line" modem 222.

In one or more embodiments, the modem 222 may be configured to cooperate with the debug/trace module 220 and with a supply line 224 (e.g., as used "natively" to supply the device 10).

In one or more embodiments, the supply line 224 may be exploited by the power line modem 222 to exchange command/data signals with a power line transmitter and receiver M external to the device 10.

In one or more embodiments the transmitter/receiver modem M may be included in a Debug Tool Chain, generally indicated DTC in FIG. 4.

One or more embodiments may thus use a power line communication channel which may replace (virtually all) externally available overhead test pins for use in debugging.

In one or more embodiments, such a connection may be permitted by a power line modem (e.g., 222) included in the device 10 itself.

In one or more embodiments, any negative pinout impact may thus be avoided by making the package footprint independent of the presence of debug/trace features (e.g., 220).

In one or more embodiments, the power line 224 may include a DC power line or an AC power line (depending on the application). Conventional power line modems able to support a data rate compatible with a desired debug (or tracing) application may be used in one or more embodiments.

In one or more embodiments (the following list is merely exemplary and not limitative of the extent of the embodiments) a power line modem as exemplified in 222 in the figures may include, e.g.:
- coupling circuitry to permit coupling with the power line 224,
- analog front/end amplification and conversion circuitry for, e.g., managing the dynamics of the signals transmitted/received while also providing conversion (e.g., digital-to-analog at the transmitter side and analog-to-digital at the receiver side), and/or
- communication protocol circuitry in order to implement communication procedures to control modem performance.

In one or more embodiments, such protocol features may be implemented in hardware and/or software form and may include, e.g., (forward) error correction communication procedures, synchronization procedures and/or modulation/demodulation procedures.

The power line transmitter and receiver modem M (which per se may not form part of the embodiments) may similarly use the power line 224 for exchanging debug (trace) signals with the power line modem 222 included in the device 10. The description of exemplary features provided in the foregoing with respect to the power line modem 222 may therefore apply also to the transmitter/receiver M.

In one or more embodiments, both these modems (that is 222 and M) may be configured to act as a transmitter/receiver within the framework of a debug (trace) functionality as discussed in the following.

In one or more embodiments, both modems 222 and M may be equipped (in a manner known per se, thus making it unnecessary to provide a more detailed description herein) with peripherals configured to permit interfacing with the rest of the debug engine.

In one or more embodiments, the debug (trace) module may include an entry module for the debug control flow. This may be configured for actuating commands from the external tool chain DTC through the modem M to debug the system.

In one or more embodiments, the power line modem 222 may be configured for collecting system information, monitoring relevant information, organizing and optionally filtering that information before this is sent to the external tool chain DTC through the power line 224 and the modem M. In one or more embodiments, a memory buffer may be implemented, e.g., to avoid data overflow within the transmission flow.

In one or more embodiments the central processing unit—CPU 120 may be configured for executing application code and controlling data flow within the system.

In one or more embodiments, the clock module 122 (possibly including an associated reset controller) may provide a reference clock signal to schedule the execution of the application running on the system.

In one or more embodiments, the program and data memory module 124 may be configured for providing storage of application program code and data.

In one or more embodiments, the input/output interface 126 may be configured for interfacing with the external world, allowing monitoring of external events and the actuation of system decisions.

While illustrated in the vicinity of the input/output interface 126, the power supply line 224 used natively to supply the device 10 and which may enable communication with the modem M, may not represent per se a part of the I/O interface 126 (that is, supply is not considered as I/O).

Figure 5:
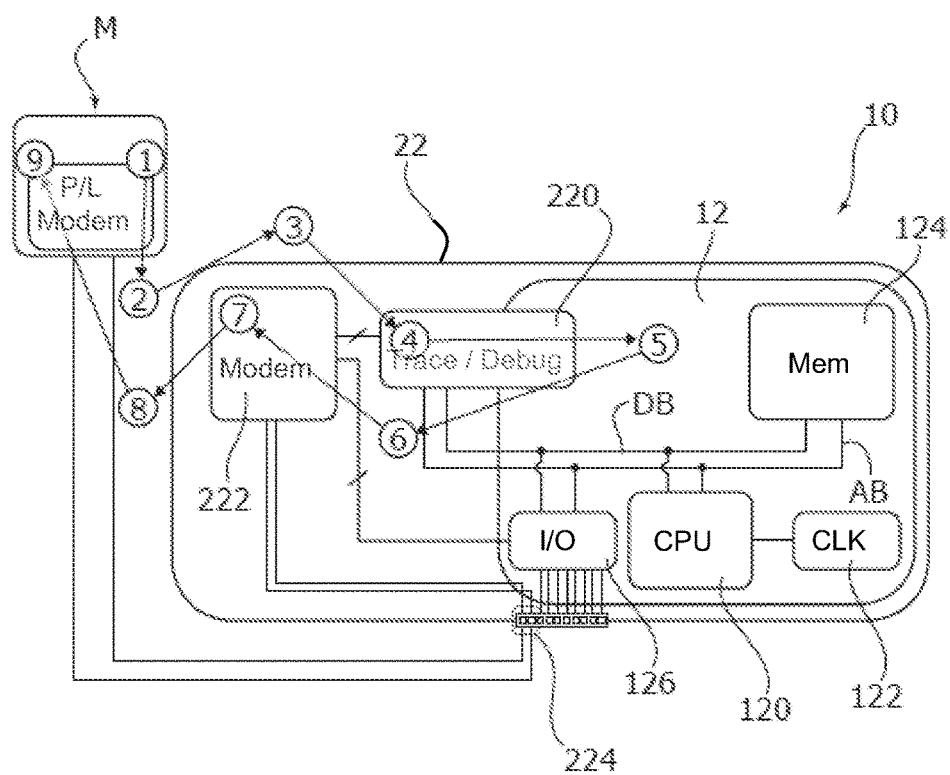
FIGS. 5 and 6 are exemplary of possible operation of one or more embodiments.

The ball points 1 to 9 in FIG. 5 are exemplary of a possible data flow during a debug session in a system as discussed previously in connection with FIG. 4.

Specifically, in the (simplified) representation of FIG. 5, the ball points 1 to 9 have the following meaning:
1: an application user aiming at debugging the system issues a command request to an entry point of the debug tool chain (DTC),
2: the command is processed and transmitted by the external power line modem M,
3: the command is received (over the power supply line 224) by the internal power line modem 222 and de-processed,
4: the command is sent to the debug (trace) module 220,
5: the debug trace module 220 provides for execution of the command,
6: a system response is collected by the module 220,
7: the response is processed and transmitted by the internal power line modem 222 to the external modem M over the power line 224,
8: the response is received by the external power line modem M and de-processed,
9: the response is elaborated in the chain DTC and provided to the application user.

Figure 6:
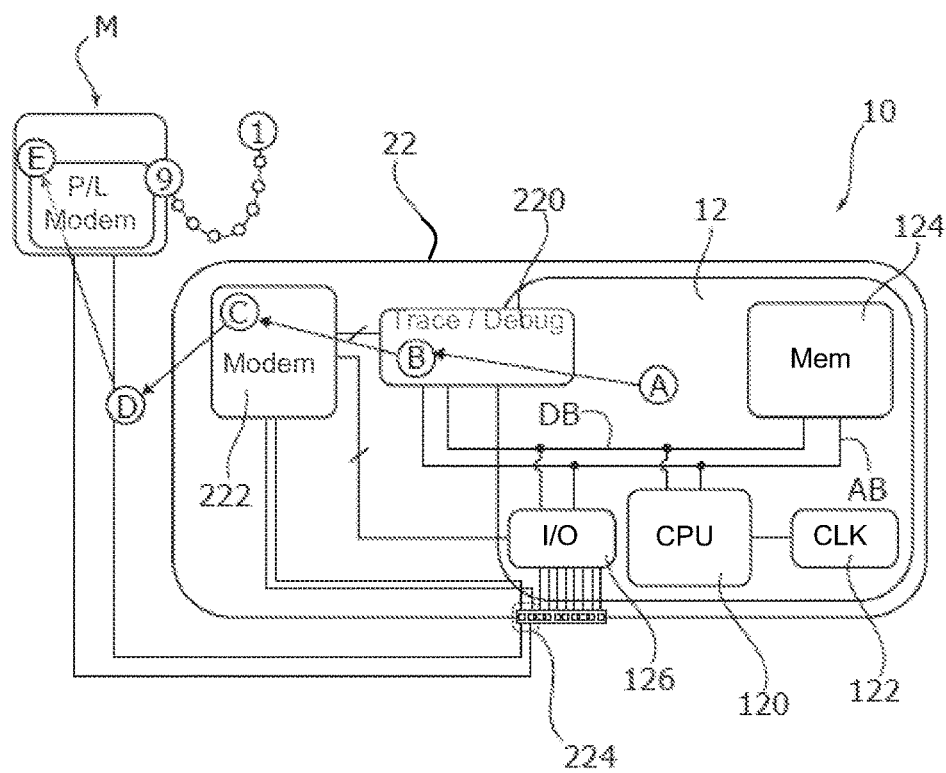

In the diagram of FIG. 6, the ball points 1 to 9 are generally exemplary of an application user programming the debug/trace module 220 in order to trigger a trace sequence: operation is as described previously in connection with FIG. 5.

The letters A to E in the ball points of FIG. 6 are exemplary of possible processing related to data flow during a typical trace session.

Specifically, the ball points A to E may have the following meaning:
A: data is extracted from the system 12,
B: data as extracted (possibly filtered and compressed) are collected/elaborated by the debug (trace) module 220 in view of being transferred to the internal power line modem 222,
C: the data as elaborated are processed and transmitted by the (internal) power line modem 222 over the power line 224,
D: data as elaborated are received by the external power line modem M over the power line 224 and de-processed,
E: data as elaborated are provided to the debug tool chain DTC (see FIG. 4); these may be possibly further elaborated off-line, e.g., to reconstruct an application execution profile.

As indicated, in one or more embodiments as exemplified herein, pinout impact may be dispensed with, by providing a package footprint which is independent of the presence of a debug/trace functionality.

Moreover, in one or more embodiments, such a pin-less solution ("pin-less" meaning that no overhead pins specialized for any debug/trace functionalities may need be present in the system 10) may avoid the cost related to the development of a dedicated board for debugging (possibly including, e.g., a dedicated connector and/or a dedicated wiring/harness).

One or more embodiments may permit a continuous functionality check, possibly with remote switching/maintenance.

One or more embodiments as exemplified herein may be advantageous, e.g., where board dimensions may turn out to be critical and/or if board cost may be significant (e.g., in the case of complex systems).

One or more embodiments may thus rely on re-using certain wires/pins (e.g., the power supply line pins) which are already available in a conventional system 10 as depicted, e.g., in FIGS. 1 and 2.

This may be advantageous, e.g., when a device to be debugged is difficult to reach. One or more embodiments may thus facilitate reachability of the device being debugged.

In one or more embodiments, the frequencies used for communication over the power line 224 may be judiciously selected in such a way as not to interfere with the frequencies used by the application to which debugging/tracing applies.

In one or more embodiments, the data rate attainable may depend on the power injected into the power line 224 (which may differ from scenario to scenario, e.g., in view of electromagnetic compatibility—EMC requirement and regulations) and/or on channel and noise conditions.

While power line communication may not be error-free, an (e.g., forward) error correction procedure may be envisaged to reduce the error rate to a target value acceptable for debug and trace applications.

One or more embodiments as exemplified previously may rely on power line 224 at the level of the system 10 (e.g., die 12).

Figure 7:
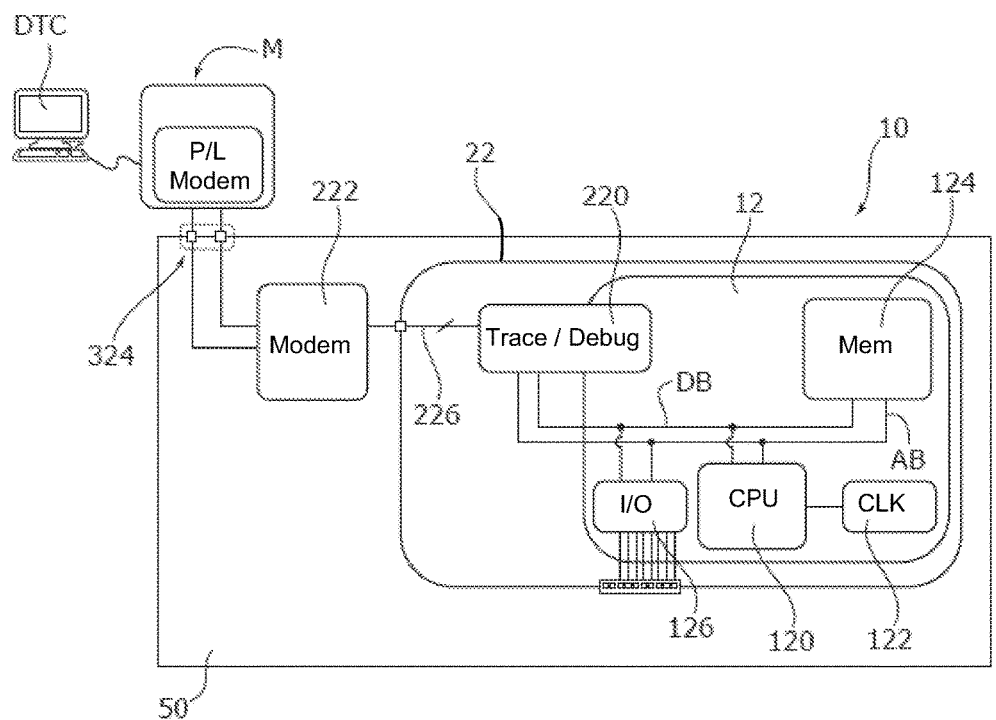
FIGS. 7 and 8 are exemplary of one or more embodiments.

The diagram of FIG. 7 is exemplary of one or more embodiments where operation as discussed previously may be achieved by exploiting, in the place of the supply/power line 224 available at system level, a supply line 324 to which the device 10 (including the system 12) may be coupled at the level of the board (e.g., a Printed Circuit Board—PCB) 50: the power supply line(s) used natively to supply the device 10 from the board supply terminal 324 are not visible for simplicity.

Figure 8:
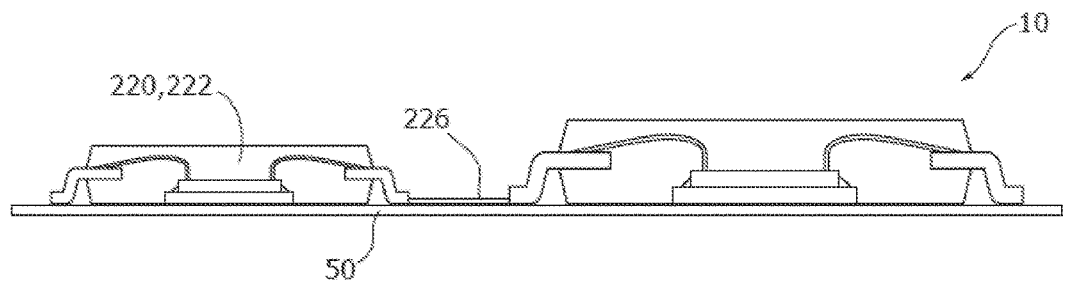

The schematic representation of FIG. 8 is exemplary of the possibility, offered by an arrangement as exemplified in FIG. 7, of leaving a basic device 10 substantially unchanged (e.g., as depicted in FIGS. 1 and 2), while incorporating the debug/trace module 220 and the power line modem 222 to an independent device mounted on the board 50 and communicating with the basic device 10, e.g., via a fast line interface 226.

Operation of the arrangement exemplified in FIGS. 7 and 8 may be as exemplified previously in connection with FIGS. 5 and 6.

One or more embodiments may thus provide a semiconductor device (e.g., 10), including:
 a semiconductor die (e.g., 12) coupled with a power supply line (at the die level, e.g., 224 or at the board level 324),
 a debug module (e.g., 220) coupled with said semiconductor die to exchange semiconductor die debug (including trace) command and data signals with the semiconductor die,
 a modem (e.g., 222) coupled with said power supply line and said debug module to exchange semiconductor die debug command and data signals over said power supply line.

In one or more embodiments:
 said power supply line may include power supply pins (e.g., 224) for the semiconductor die,
 said modem may be coupled with said power supply pins of the semiconductor die.

In one or more embodiments, at least one of said debug module and said modem may be included in a common package (e.g., 16) with said semiconductor die.

In one or more embodiments:
 said semiconductor die may be mounted on a support board (e.g., 50) having power supply terminals (e.g., 324) for said support board,
 said modem may be coupled with said power supply terminals for said support board to exchange semiconductor die debug command and data signals over said power supply line.

In one or more embodiments, said modem and, optionally, said debug module may be integrated to an additional semiconductor die mounted on said support board.

One or more embodiments may include a (fast) line interface (e.g., 226) between said semiconductor die and said additional semiconductor die.

One or more embodiments may provide a method of debugging a semiconductor device, the method including the device exchanging debug commands and data signals with a debugging system (e.g., DTC) external to the semiconductor device, wherein the method includes:
 providing the semiconductor device with a power supply line (e.g., 224, 324), and
 the semiconductor device exchanging said debug command and data signals with said debugging system over said power supply line.

Without prejudice to the underlying principles, the details and embodiments may vary, even significantly, with respect to what has been disclosed in the foregoing without departing from the extent of protection.

The extent of protection is defined by the annexed claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor device, comprising:
 a semiconductor die that includes functional circuitry configured to receive power from a power supply line;
 a debug module coupled with said semiconductor die, wherein said debug module is arranged to exchange semiconductor die debug command and data signals with the semiconductor die; and
 a power line modem coupled with said debug module, wherein said power line modem is arranged to exchange the semiconductor die debug command and data signals over said power supply line.

2. The semiconductor device of claim 1, comprising:
 a plurality of power supply pins configured to be connected to said power supply line, wherein said plurality of said power supply pins are coupled to the semiconductor die, and wherein said power line modem is coupled with said power supply pins of the semiconductor die.

3. The semiconductor device of claim 1, wherein at least one of said debug module and said modem is included in a common package with said semiconductor die.

4. The semiconductor device of claim 1, comprising:
a support board, wherein said semiconductor die is physically coupled to said support board, the support board having a plurality of power supply terminals, wherein said modem is coupled with said power supply terminals to exchange semiconductor die debug command and data signals over said power supply line.

5. The semiconductor device of claim 4, comprising:
a second semiconductor die mounted on said support board, wherein said modem and said debug module are integrated with said second semiconductor die mounted on said support board.

6. The semiconductor device of claim 5, comprising:
a line interface arranged between said semiconductor die and said second semiconductor die.

7. The semiconductor device of claim 1, comprising:
functional circuitry formed on the semiconductor die, said functional circuitry including at least a processing unit, memory, and one or more buses, the one or more buses coupling the functional circuitry to the debug module.

8. The semiconductor device of claim 7, comprising:
a second semiconductor die having the debug module formed thereon, the semiconductor die and the second semiconductor die physically coupled together and embedded in a single package.

9. The semiconductor device of claim 8, wherein the modem is formed on the second semiconductor die.

10. The semiconductor device of claim 1, wherein the semiconductor device has a package footprint which is independent of debug functionality provided by the debug module.

11. A semiconductor device debugging method, comprising:
coupling a semiconductor device to a debug system by at least one power supply line, the debug system being external to said semiconductor device; and
communicating debug command and data signals between the semiconductor device and the debug system over said at least one power supply line.

12. The semiconductor device debugging method of claim 11, wherein communicating debug command and data signals between the semiconductor device and the debug system over said at least one power supply line includes communicating via a pair of powerline modems.

13. The semiconductor device debugging method of claim 12, comprising:
accepting user input via the debug system, the user input including at least one debug command;
communicating the at least one debug command via the pair of powerline modems to the semiconductor device; and
processing the at least one debug command with a debug module internal to the semiconductor device.

14. The semiconductor device debugging method of claim 12, comprising:
processing at least one debug command with a debug module internal to the semiconductor device;
capturing debug data signals generated by functional circuitry of the semiconductor device with the debug module internal to the semiconductor device; and
communicating the captured debug data signals to the debug system via the pair of powerline modems.

15. The semiconductor device debugging method of claim 11, wherein communicating debug command and data signals between the semiconductor device and the debug system over said at least one power supply line includes correcting at least some errant data signals when said errant data falls below a selected error rate.

16. A debug system, comprising:
a semiconductor device having;
a first powerline communications modem internal to the semiconductor device;
at least one power supply line;
a second powerline communications modem external to the semiconductor device;
a debug tool chain communicatively coupled to the semiconductor device via the first and second powerline communications modems, wherein said first and second powerline communications modems are arranged to exchange debug command and data signals over said at least one power supply line.

17. The debug system of claim 16, wherein the semiconductor device has an absence of any debug pins except for the at least one power supply line.

18. The debug system of claim 16, wherein the semiconductor device is formed in a wearable device, an underwater device, or an implanted medical device.

19. The debug system of claim 16, wherein the semiconductor device is formed in a production device.

20. The debug system of claim 16, wherein at least some data communicated between the debug tool chain and the semiconductor device is compressed data.

* * * * *

UNITED STATES PATENT AND TRADEMARK OFFICE
CERTIFICATE OF CORRECTION

PATENT NO. : 10,254,338 B2
APPLICATION NO. : 15/221211
DATED : April 9, 2019
INVENTOR(S) : Nicolas Bernard Grossier et al.

It is certified that error appears in the above-identified patent and that said Letters Patent is hereby corrected as shown below:

Column 10, Line 26 In Claim 16:
"a semiconductor device having;"
Should read:
--a semiconductor device;--.

Signed and Sealed this
Fourth Day of June, 2019

Andrei Iancu
*Director of the United States Patent and Trademark Office*